(12) United States Patent
Joshi et al.

(10) Patent No.: US 11,014,187 B2
(45) Date of Patent: May 25, 2021

(54) METHOD OF MANUFACTURING RADIO FREQUENCY (RF) COIL MULTI-DRIVEN RF BASED NEGATIVE ION SOURCE

(71) Applicant: Institute for Plasma Research, Gandhinagar (IN)

(72) Inventors: Jaydeep Joshi, Ahmedabad (IN); Chandra Mouli Rotti, Ahmedabad (IN); Arun Kumar Chakraborty, Ahmedabad (IN); Mainak Bandyopadhyay, Ahmedabad (IN); Agrajit Gahlaut, Gandhinagar (IN); Milind Kumar Patel, Ahmedabad (IN); Venkata Nagaraju Muvvala, Ahmedabad (IN); Deepak Kumar Parmar, Ahmedabad (IN)

(73) Assignee: Institute for Plasma Research, Gujarat (IN)

( * ) Notice: Subject to any disclaimer, the term of this patent is extended or adjusted under 35 U.S.C. 154(b) by 287 days.

(21) Appl. No.: 16/058,195

(22) Filed: Aug. 8, 2018

(65) Prior Publication Data
US 2019/0314922 A1   Oct. 17, 2019

(30) Foreign Application Priority Data
Apr. 13, 2018   (IN) .............................. 201821014176

(51) Int. Cl.
| B23K 9/167 | (2006.01) |
| C25D 3/38 | (2006.01) |
| C25D 7/00 | (2006.01) |
| H01J 37/32 | (2006.01) |

(52) U.S. Cl.
CPC ................ *B23K 9/167* (2013.01); *C25D 3/38* (2013.01); *C25D 7/00* (2013.01); *H01J 37/3211* (2013.01)

(58) Field of Classification Search
CPC .. B23K 9/167; C25D 3/38; C25D 7/00; H01F 27/16; H01F 27/2876; H01F 41/10; H01J 2237/08; H01J 37/3211
See application file for complete search history.

(56) References Cited

U.S. PATENT DOCUMENTS

| 4,016,389 A * | 4/1977 | White ..................... C23C 14/32 219/634 |
| 5,396,039 A * | 3/1995 | Chevrel ............... B23K 9/0286 219/137 R |
| 6,371,359 B1 * | 4/2002 | Kimura .................. B23K 11/02 228/175 |
| 10,480,863 B2 * | 11/2019 | Joshi ..................... B21D 53/08 |

(Continued)

FOREIGN PATENT DOCUMENTS

EP   3553797 A1 * 10/2019

OTHER PUBLICATIONS

WO 95/22153, Marchegiani, Aug. 17, 1995 (Year: 1995).*

*Primary Examiner* — Minh N Trinh
(74) *Attorney, Agent, or Firm* — The Webb Law Firm

(57) ABSTRACT

A method of manufacturing a Radio Frequency (RF) coil for a multi-driven RF based negative ion source includes manufacturing a first coil and a second coil using tubes of stainless steel as a substrate material, coating the first coil and the second coil separately; and joining the first coil and the second coil by orbital TIG welding after coating the first coil and the second coil to provide the RF coil for the multi-driven RF based negative ion source.

9 Claims, 8 Drawing Sheets

(56) References Cited

U.S. PATENT DOCUMENTS

2018/0009055 A1* 1/2018 Amaro-Barboza .......................... B23K 9/0253
2019/0314922 A1* 10/2019 Joshi ........................ C25D 3/38

* cited by examiner

METHOD OF MANUFACTURING RADIO FREQUENCY (RF) COIL MULTI-DRIVEN RF BASED NEGATIVE ION SOURCE

CROSS-REFERENCE TO RELATED APPLICATION

This application claims priority to Indian Patent Application No. 201821014176 filed Apr. 13, 2018, the disclosure of which is hereby incorporated in its entirety by reference.

FIELD OF THE INVENTION

The present invention relates to a method of manufacturing a Radio Frequency (RF) coil for a multi-driven RF based negative Ion source.

BACKGROUND OF THE INVENTION

Water cooled RF coils for the plasma generation in RF based negative ion sources are structures consisting of tube (with diameter 8 mm, thickness 1 mm) wounded in a coil of diameter ~300 mm with 6.5 to 8.5 number of turns equally spaced with pitch of 12 mm.

For a multi driven negative ion RF source, where two RF drivers are placed side by side, two such coils are installed in series with an interconnection between them. At both ends of this series connection, a hydraulic circuit is attached to feed water into the coil. From the functional point of view, to meet the electrical conductivity requirements, material for this coil are chosen as CuOF (Oxygen Free copper).

The following is a list of prior art known to exist for interconnection and end connection of the above mentioned coils:

A. Demountable Connection

Inter-connection between two coils (to make a series of coils) and end connection by demountable (e.g. Swagelok, Dockweiler connections).

B. Brazing
(i) Brazing of CuOF to CuOF tube as inter-connection (ii) brazing of CuOF to SS tube as end connection.

C. Electron Beam Welding (EBW)
(i) Electron Beam Welding of CuOF to CuOF tube as inter-connection (ii) Electron beam welding of CuOF to SS tube through Inconel/Nickel transition.

D. Manufacture of the coil from single tube

Make a coil from single tube and choose one of the above prior art to make the end connection.

Following are the drawbacks of the above-discussed prior art techniques:

a) Demountable connection
   Maintenance issue.
   Reliability of demountable connection.
   Such connection is not allowed for water to vacuum boundary connection, specifically in nuclear environment.
   Tightening and un-tightening induces reaction forces on the ceramic elements (which are placed at the end for functional needs) and involves risk of breakage.

b) Brazing
   Not a reliable connection for water to vacuum boundary joint.
   Joint efficiency of braze is <100% and therefore mechanical properties are compromised.
   Volumetric integrity of the joint cannot be ensured because it is not possible to inspect it by volumetric examination technique.
   Such connection is not allowed for water to vacuum boundary connection, specifically in nuclear environment.

c) Electron Beam Welding (EBW)
   Not possible to weld within the vacuum chamber due to requirement of rotation of coils.
   Customized vacuum chamber and fixtures for coil to coil welding.
   Not possible for in-situ connection of dissimilar material (Cu—Ni—SS) for end connections.

d) Manufacture the coil from a single tube
   The length required to execute this in a single piece i.e. without inter-connection is ~13 m. Handling of this length required special fixturing arrangement for wounding in the desired shape. Additionally, to make the end connection, dependency on the above mentioned prior art is not completely eliminated and therefore limitations still exist.

Additionally, it was noticed during the manufacturing of an RF coil for an RF negative Diagnostic Neutral Beam (DNB) source, the conventional technique of using copper coil involves many limitations with respect to meeting the compliance of water to vacuum boundary connection.

Further, it becomes difficult to handle (because of inherent flexibility of copper material and electrical isolation requirements) such RF-coils when it comes to a multi driven RF ion source and that too in vacuum environment.

SUMMARY OF THE INVENTION

It is therefore an object of the invention to propose a method of manufacturing a Radio Frequency (RF) coil for a multi-driven RF based negative Ion source, which allows joining of two coils with each other and to a water cooling circuit by means of orbital TIG welding tool.

Another object of the invention is to propose a method of manufacturing a Radio Frequency (RF) coil for a multi-driven RF based negative Ion source, which achieves full penetration welding and ensure the weld integrity by means of 100% volumetric examination.

A still another object of the invention is to propose a method of manufacturing a Radio Frequency (RF) coil for a multi-driven RF based negative Ion source, which incorporates sufficient stiffness into the coil and make them rigid enough to eliminate the use of electrical isolation/spacers.

A further object of the invention is to propose a method of manufacturing a Radio Frequency (RF) coil for a multi-driven RF based negative Ion source, which eliminates the joining of copper to copper/cooper to stainless steel by brazing and electron beam welding and at the same time comply with the requirement of water to vacuum boundary connection.

Accordingly, there is provided a method of manufacturing a Radio Frequency (RF) coil for a multi-driven RF based negative Ion source. It is noted based on the principle of RF power transmission that RF flows only through the skin depth and remaining material thickness works only as the back-up and heat sink.

Therefore, embodiments of the present invention realize the process of manufacturing of an RF coil, which replaces the CuOF coil by Stainless steel coil with Cu plating. Stainless steel material works as the structural member whereas Cu plating functions as the conductive layer for RF power transmission.

DETAIL DESCRIPTION OF THE INVENTION

Figure 1:
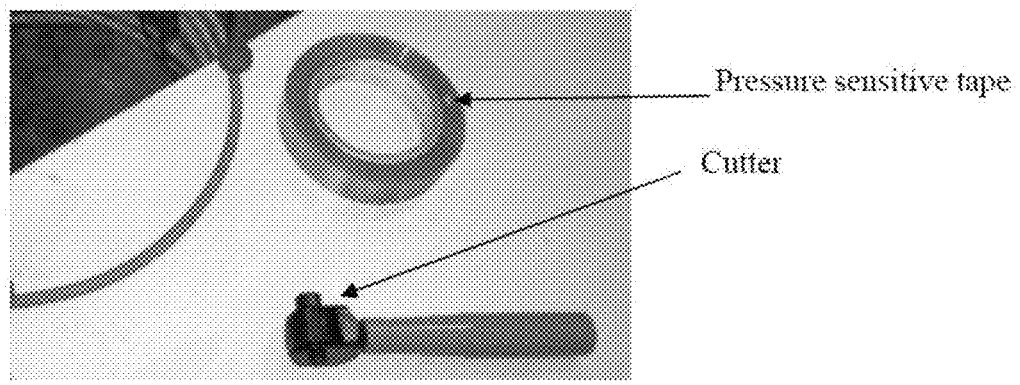
FIG. 1—Instruments used for test.
Figure 2:
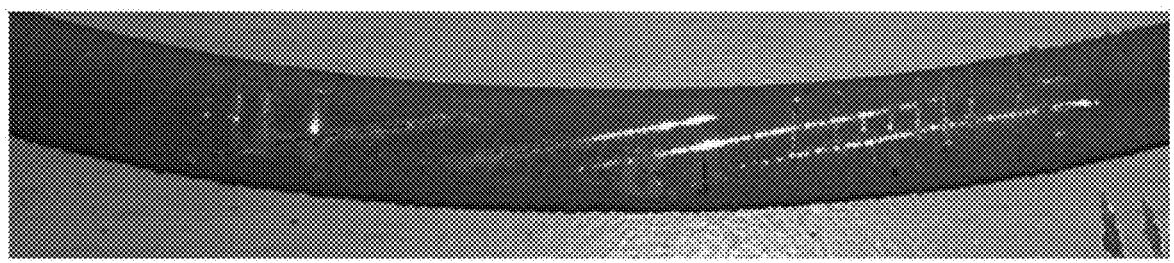
FIG. 2—Stage 1: Performing cuts on layer by cutter.
Figure 3:
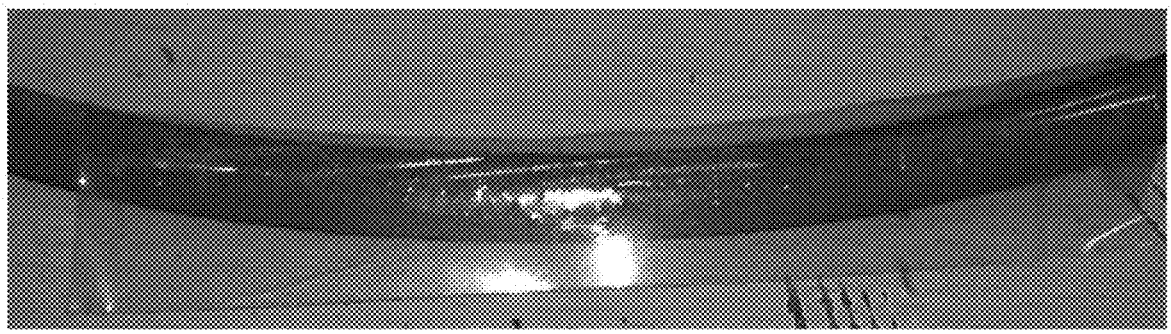
FIG. 3—Stage 2: Apply pressure sensitive tope.
Figure 4:
FIG. 4—Removal of tape and compare with the standard chart available in ASTM D 3359.
Figure 5:
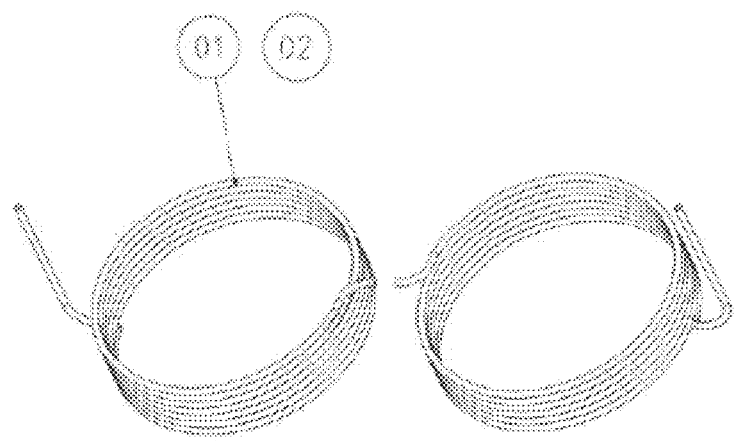
FIG. 5—RF coils manufactured as per inventive process.
Figure 6:
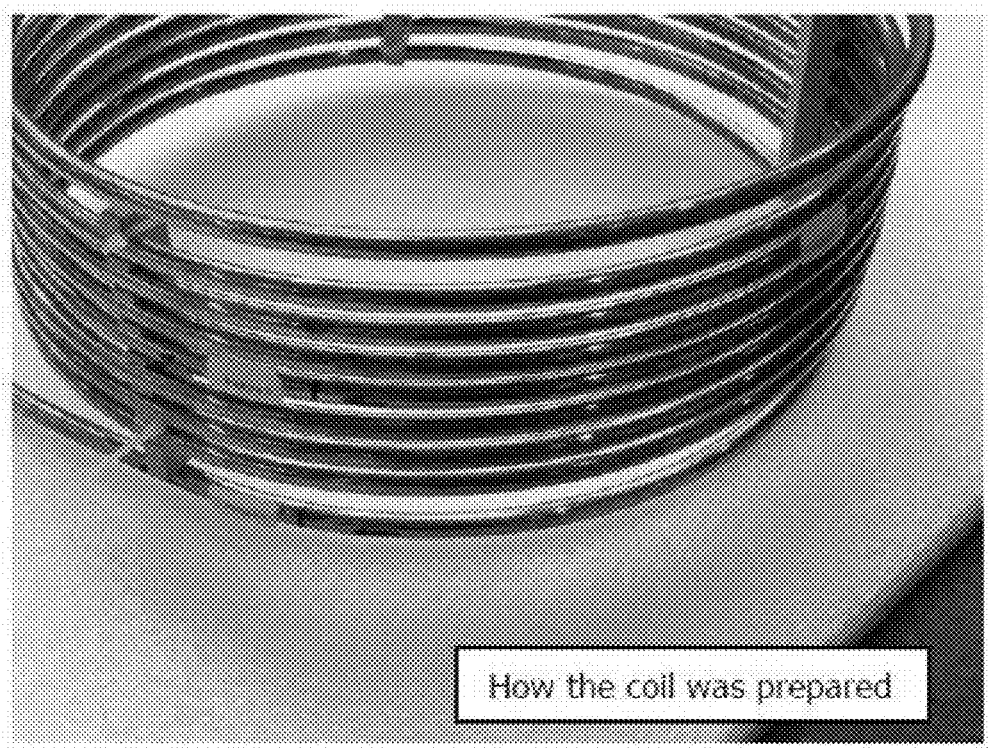
FIG. 6—Final manufactured coil.
Figure 7:
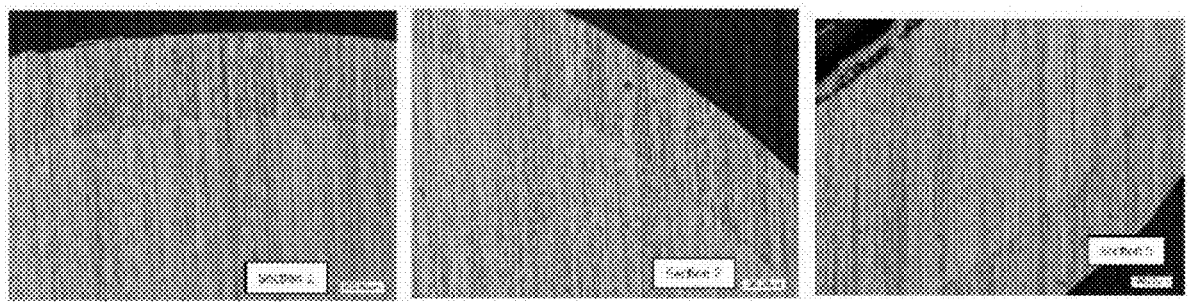
FIG. 7—Cut-sections at various locations.

The invention methodology of manufacturing of an RF coil involves the use of stainless steel (grade 304L) as the substrate material to manufacture a tube, which then is applied with copper plating to provide a 100 micron thick conductive layer for RF power to flow. From the functional requirement, the thickness requirement is estimated to be ~75 micron and considering the process tolerances, the targeted thickness is set as 100 micron. Such coating is applied through electro-plating process and it is established to achieve the thickness of 150-200 microns, which is in compliance with the functional requirement. Having ensured the thickness requirement, the copper coated coil has also been subjected to the electrical test and metallographic examination to ensure the performance, which was found to be in line with the requirement. The thermal calculation shows that the temperature rise in material is negligible and does not affect the thermo-hydraulic design.

From the functional point of view, for 1 MHz frequency, the required skin depth is in the range of ~75 µm. Therefore, a layer of copper >100 µm is considered to be sufficient by taking the possible variations in manufacturing process into account. The manufacturing technique has been progressively devolved on a trial coil (1:1 to the actual dimensions), where the thickness of a copper layer on the SS base tube was optimized by controlling the electro-plating process parameters. Subsequently, the thickness on the whole surface area was achieved beyond the functional requirement of 100 microns min. Further, the repeatability and consistency of the process has been ensured by the production of three similar coils. These coils have been subjected to metallographic examination, which revealed the thickness range of 150-200 microns on all the areas of the coils. As an additional proof for the sufficient and even thickness of the Cu-layer (>100 µm), the plated coil has been cut on several places and some cross sections have been made and the thickness has been directly measured. To ensure the electrical performance, with the above mentioned manufactured prototype coils, the electrical characteristics of an ED plated coil have been checked and compared with respect to the pure copper coil keeping the dimensional configuration same. Result shows that inductance at 1 MHz is reduced by 5%, which, if required can be compensated by using the flexibility of adjusting the frequency and therefore could be considered as the acceptable.

Thus, the innovative methodology of realization of the RF coil involves manufacturing of the RF coil from SS (grade 304L) material and provide a copper layer with the thickness sufficient to meet the RF power transmission through the skin depth.

Accordingly, a prototype coil material with 8.5 turns, wounding diameter 300 mm, tube diameter 8 mm, thickness 1 mm and pitch of 12 mm has been selected and provided with electro-deposited plated copper with a targeted thickness of 100 micron copper. Process optimization has resulted in achieving the desired thickness of copper on SS base tube through an ED plating process, which exhibited consistent results on three coils with 1:1 dimensions.

Process Validation

1. Thickness of Layer:

Based on the RF power, the requirement of layer thickness is 75 microns. Considering the practical scenario, the targeted thickness was >100 microns. Two techniques have been utilized to check the thickness:

i. Non-destructive examination through Ultrasonic Thickness measurement devise:

ii. Destructive testing by macro examination of layer (c/s across various locations along the coil) and measuring through optical microscope Result from both of the above mentioned techniques shows that the thickness achieved was ranging from 150 to 200 microns.

2. Porosity Check:

Destructive testing performed by taking c/s at various locations showed the pore free and uniform macro structure. The absence of porosity could also be ensured by the electrical test, where the parameters achieved were in-line with the oxygen free copper (as evident from the table 1).

3. Electrical Characteristics:

Electrical values have been measured with Agilent Precision LCR-Meter 4285A. Following table shows the summary of electrical properties, which are relevant from the functional point of view.

TABLE 1

| Coil: d ~300 mm, 8.5 wdg. | f | Inductance [µH] | Impedance Z [Ω] | φ [°] |
| --- | --- | --- | --- | --- |
| Coil from Cu-tube 8 × 1 mm | 500 kHz | 29.7 | 93.2 | 89.5 |
|  | 1 MHz | 30 | 189 | 89.5 |
| ED-plated coil | 500 kHz | 28 | 87 | 89.5 |
|  | 1 MHz | 28.5 | 175 | 89.5 |

It is seen from the table that inductance at 1 MHz is reduced only by ~5% and therefore could be concluded that the ED plated coil is functionally as competent as the pure copper coil.

4. Thermal Assessment of the Cu Plated Coil:

Calculations (Table 2) have been made to see the effect of the change in material from CuOF to SS with Cu plating. From the table, it is seen that due to this change, temperature rise in the material is only 3 deg C. and could be considered as negligible. This is because the major contributor of heat generation is RF power and it flows through only skin depth. For the both cases, skin depth remains the same and the mentioned small temperature rise is attributed to the poor heat conductivity of SS from inner wall to outer wall.

TABLE 2

|  |  | Copper Coil |  | SS Coil with Cu plating |  |
| --- | --- | --- | --- | --- | --- |
| OD of tube (D) |  | 8 | mm | 8 | mm |
| ID of tube (d) |  | 6 | mm | 6 | mm |
| Thk of tube |  | 1 | mm | 1 | mm |
| Coil dia |  | 300 | mm | 300 | mm |
| Length of coil (L) |  | 12246 | mm | 12246 | mm |
| Approx length upto header (L') |  | 16000 | mm | 16000 | mm |
| A (Heat transfer) |  | 0.23071464 | m$^2$ | 0.23071464 | m$^2$ |
| A (c/s) |  | 21.98 | mm$^2$ | 21.98 | mm$^2$ |
| Frequency (f) |  | 1 | MHz | 1 | MHz |
| Relative permeability ($\mu_r$) |  | 0.999991 |  | 1.003 |  |
| Absolute permeability ($\mu_0$) | $4\pi \times 10^{-7}$ | 1.25664E-06 | H/m | 1.25664E-06 | H/m |
| Skin Depth | $[\rho/(\pi\, f\, \mu_o\, \mu_r)]^{1/2}$ | 0.065 | mm | 0.065 | mm |
| A (skin) |  | 0.815725653 | mm$^2$ | 0.81450615 | mm$^2$ |
| Resistivity of active layer ($\rho$) |  | 1.68E-08 | Ohm m | 1.68E-08 | Ohm m |
| Current (I) |  | 100 | amp | 100 | amp |
| Resistance (R) | $\rho L/A$ (skin) | 2.52E-01 | Ohm | 2.52E-01 | Ohm |
| Power loss (P) | I$^2$ R | 2.52E+03 | W | 2.52E+03 | W |
|  |  | 2.52E+00 | kW | 2.52E+00 | kW |
| Power loss in four set of coils (P') |  | 1.01E+01 | kW | 1.01E+01 | kW |
| Pressure drop Calculation |  |  |  |  |  |
| Friction function (f) |  | 0.0254 |  | 0.0254 |  |
| velocity (v) |  | 4.5 | m/s | 4.5 | m/s |
| water density ($\rho$) |  | 1000 | kg/m$^3$ | 1000 | kg/m$^3$ |
| Pressure drop in a couple of coil | $f \rho v^2 L/(2d)$ | 685800 | Pa | 685800 | Pa |
| Rise in water temperature |  |  |  |  |  |
| water Cp |  | 4.2 | kJ/kg K | 4.2 | kJ/kg K |
| mass flow rate (m) |  | 0.15 | m/s | 0.15 | m/s |
| Temp rise ($\Delta$T) of water | P'/(Cp m) | 15.99 | Deg | 16.02 | Deg |
| Rise in material wall temperature |  |  |  |  |  |
| Material thermal cond. (kc) |  | 385 | W/mK | 16 | W/mK |
| Temp rise ($\Delta$T) of material | (P' × thk)/[K$_c$ × A (heat trans.)] | 0.11 | Deg | 2.73 | Deg |

5. Adhesion Test:

Peel test has been performed in accordance with ASTM D3359 (Standard Test Methods for Measuring Adhesion by Tape Test) to check the adhesion of the Cu layer. The test has been carried out with the help of standard cutter and pressure sensitive tape (as seen in the accompanied photograph).

The result, assessed as per guidelines in ASTM D 3359, shows the adequate adhesion of Cu layer with the substrate SS material. As the % area removed was zero, the adhesion test result could be classified as category 5B.

6. Measurement on Surface Roughness: Measured Value of Surface Roughness by a Contact Type Measurement Tester is Better than 6.3 Microns Ra.

The main advantages of the invention
Brazing is eliminated therefore the joint integrity is ensured by carrying out 100% volumetric examination of an orbital TIG welded joint.
Electron beam welding is eliminated therefore assembly could be realized and in-situ weld could be performed by an orbital TIG welding tool.
Sufficient stiffness could be introduced into the coil by using SS as the material and therefore self-stable structure is achieved. This avoids the use of electrical isolator/spacer and therefore complex interfaces are not involved in the system.

Industrial use of the invention:
The technology of manufacturing can be used for upcoming negative Ion multi driver RF based neutral beam sources which are operated in vacuum.
This technology can also be utilized for other RF applications like RF transmission lines.

Figure 8A:
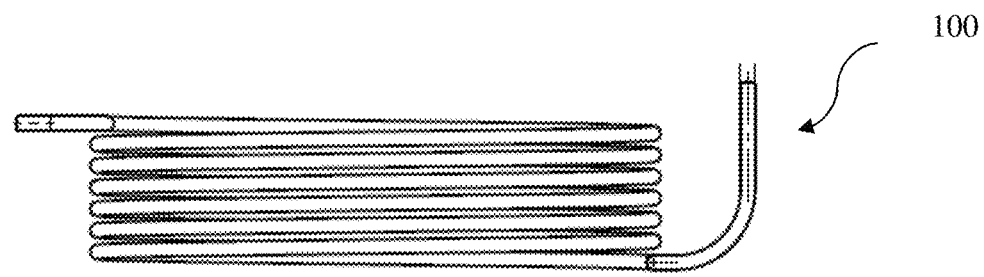
FIGS. 8A-8C are diagrams of a first coil.
Figure 8B:
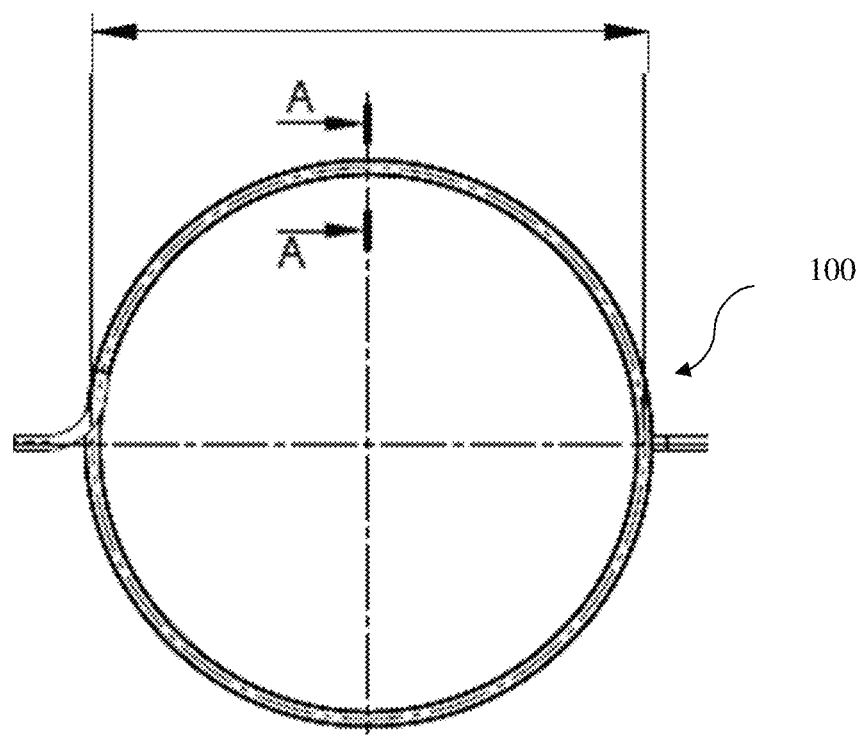
Figure 8C:
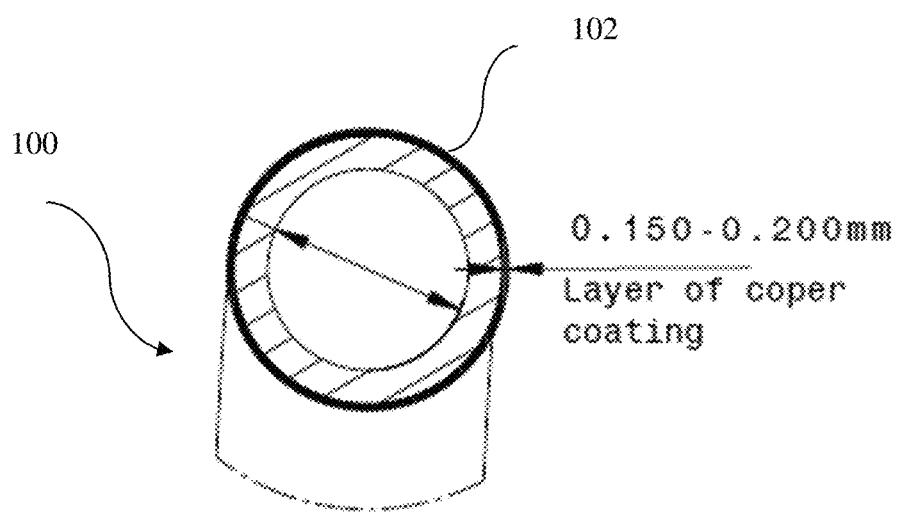

FIGS. 8A-8C are diagrams of a first coil 100 of a Radio Frequency (RF) coil for a multi-driven RF based negative Ion source. As shown in FIGS. 8A-8B, the first coil 100 may be manufactured using a tube of stainless steel grade as a substrate material. FIG. 8C is a cross-section of the first coil 100 along the line A-A. As shown in FIG. 8C, the first coil 100 may be coated with a layer of copper 102 that has a thickness that is between 150 to 200 microns.

Figure 9A:
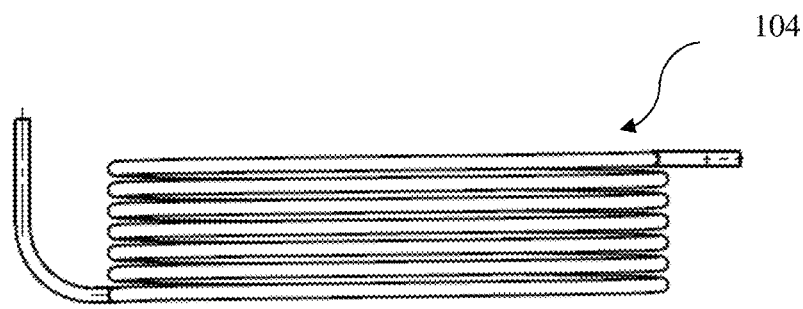
FIGS. 9A-9B are diagrams of a second coil.
Figure 9B:
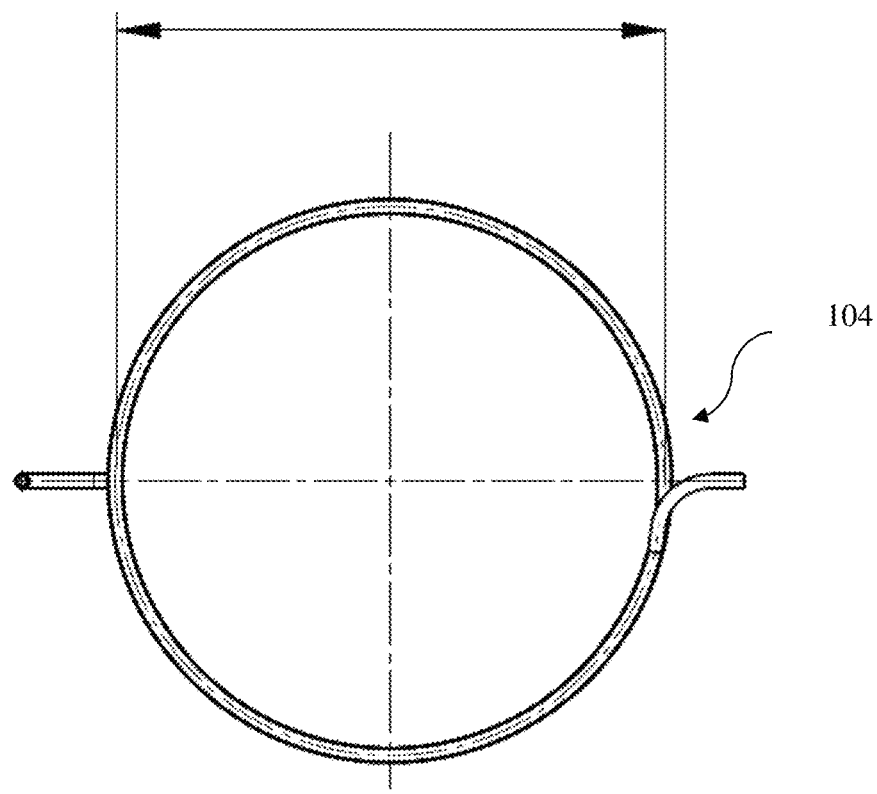

FIGS. 9A-9B are diagrams of a second coil 104. As shown in FIGS. 9A-9B, the second coil 104 may be manufactured using a tube of stainless steel grade as a substrate material. Similar to the first coil 100, the second coil 104 may be coated with a layer of copper that has a thickness that is between 150 to 200 microns.

In some non-limiting embodiments, the first coil 100 and the second coil 102 may be coated separately with the layer of copper (e.g., which has a thickness that is between 150 to 200 microns). In some non-limiting embodiments, there may be an absence of porosity in the copper coating layer of the first coil 100 and/or the second coil 102. In some non-limiting embodiments, a surface roughness of the layer of copper of the first coil 100 and/or the second coil 102 may be better than 6.3 microns Ra. In some non-limiting embodiments, an adhesion of the layer of copper of the first coil 100 and/or the second coil 102 with the substrate material is found in line with a requirement of category 5B as per ASTM D 3359 guidelines.

Figure 10A:
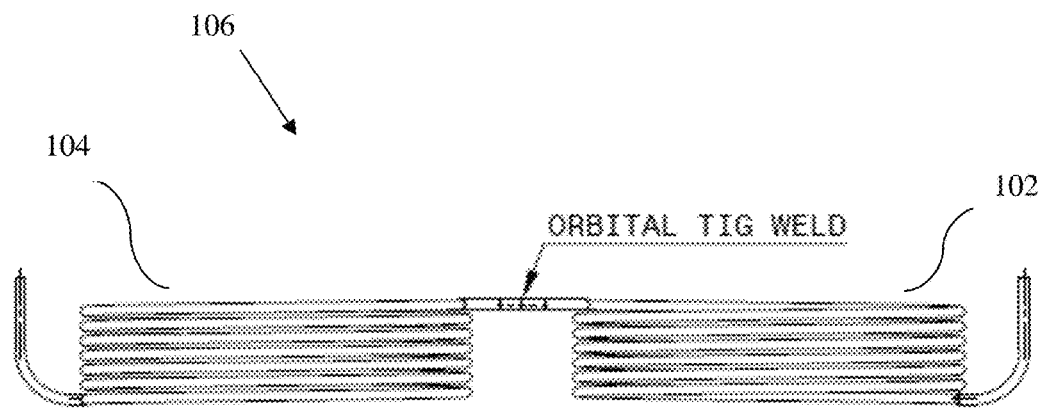
FIGS. 10A-10B are diagrams of a Radio Frequency (RF) coil for a multi-driven RF based negative Ion source.
Figure 10B:
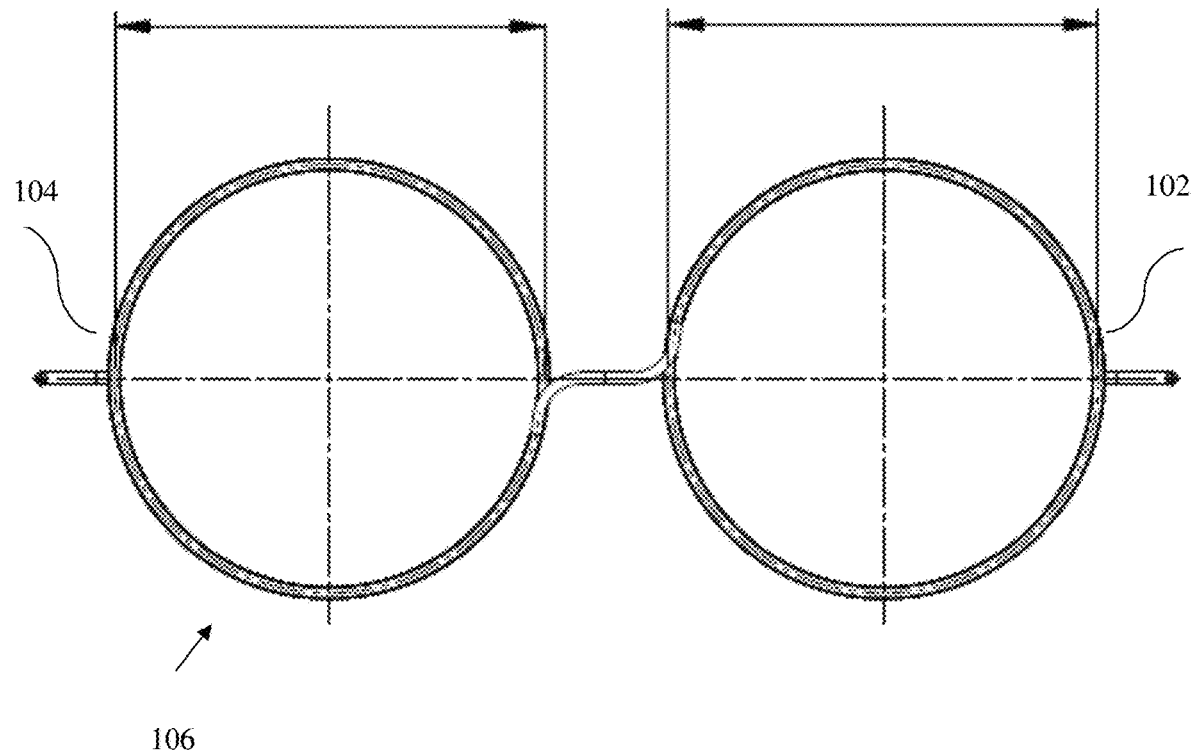

FIGS. 10A-10B are diagrams of an RF coil 106 for a multi-driven RF based negative Ion source. As shown in FIGS. 10A-10B, the RF coil 106 may be formed by joining the first coil 100 and the second coil 104 by orbital tungsten inert gas (TIG) welding. In some non-limiting embodiments, the RF coil 106 may be formed by joining the first coil 100 and the second coil 104 by orbital TIG welding after coating the first coil 100 and the second coil 102 with the layer of copper. In some non-limiting embodiments, joining the first coil 100 and the second coil 104 may include achieving full penetration welding and the RF coil 106 can be inspected 100% volumetrically. In some non-limiting embodiments, the RF coil 106 reduces inductance at a 1 MHz frequency as compared to a bare copper tube. In some non-limiting embodiments, the RF coil 106 for the multi-driven RF negative ion source is a self-stable structure and does not require inter-turn spacers to maintain an isolation gap.

Figure 11:
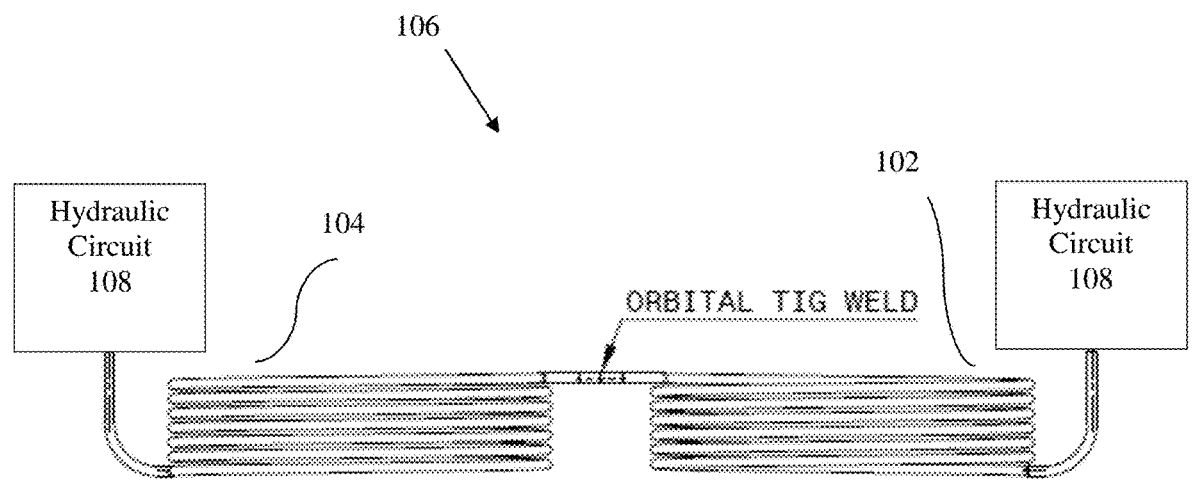
FIG. 11 is a diagram of an RF coil for a multi-driven RF based negative Ion source with hydraulic circuits.

FIG. 11 is a diagram of the RF coil 106 for a multi-driven RF based negative Ion source with hydraulic circuits 108. As shown in FIG. 11, the RF coil 106 may include the first coil 100 and the second coil 104, which may be joined by orbital TIG welding, and two hydraulic circuits 108. In some non-limiting embodiments, the RF coil 106 may include the hydraulic circuits 108 joined at each end of the RF coil 106 by orbital TIG welding.

We claim:

1. A method of manufacturing a Radio Frequency (RF) coil for a multi-driven RF based negative ion source, the method comprising:
   providing a substrate material that includes tubes of stainless steel prior to manufacturing a first coil and a second coil;
   manufacturing the first coil and the second coil by using tubes of stainless steel as a substrate material;
   coating the first coil and the second coil separately; and
   joining the first coil and the second coil by orbital TIG welding after coating the first coil and the second coil to form the RF coil for the multi-driven RF based negative ion source.

2. The method as claimed in claim 1, further comprising:
   joining a hydraulic circuit at each end of the RF coil for the multi-driven RF negative ion source by orbital TIG welding.

3. The method as claimed in claim 1, wherein the joining the first coil and the second coil by orbital TIG welding comprises achieving full penetration welding and the RF coil for the multi-driven RF negative ion source is inspected 100% volumetrically.

4. The method as claimed in claim 1, wherein the RF coil for the multi-driven RF negative ion source is configured to meet an electrical inductance at 1 MHz frequency as compared to a bare copper tube.

5. The method as claimed in claim 1, wherein coating the first coil and the second coil comprises coating the first coil and the second coil with a layer of copper with a thickness that is between 150 to 200 microns.

6. The method as claimed in claim 1, wherein coating the first coil and the second coil comprises coating the first coil and the second coil with a layer of copper and wherein there is an absence of porosity in the layer of copper.

7. The method as claimed in claim 1, wherein coating the first coil and the second coil comprises coating the first coil and the second coil with a layer of copper and wherein a surface roughness of the layer of copper is better than 6.3 microns Ra.

8. The method as claimed in claim 1, wherein coating the first coil and the second coil comprises coating the first coil and the second coil with a layer of copper and wherein an adhesion of the layer of copper with the substrate material is configured based on a requirement of category 5B as per ASTM D 3359 guidelines.

9. The method as claimed in claim 1, wherein the RF coil for the multi-driven RF negative ion source is a self-stable structure without inter-turn spacers to maintain an isolation gap.

\* \* \* \* \*